United States Patent [19]

Ogihara et al.

[11] 4,299,873
[45] Nov. 10, 1981

[54] MULTILAYER CIRCUIT BOARD

[75] Inventors: Satoru Ogihara; Mitsuru Ura; Yoshihiro Suzuki, all of Hitachi, Japan

[73] Assignee: Hitachi, Ltd., Tokyo, Japan

[21] Appl. No.: 138,073

[22] Filed: Apr. 7, 1980

[30] Foreign Application Priority Data

Apr. 6, 1979 [JP] Japan ................................. 54/40954

[51] Int. Cl.³ .............................................. B32B 3/10
[52] U.S. Cl. ................................... 428/137; 156/252; 428/210; 428/901
[58] Field of Search .................. 156/89, 252; 428/901, 428/210, 137, 131

[56] References Cited

U.S. PATENT DOCUMENTS

| | | | |
|---|---|---|---|
| 3,725,186 | 4/1973 | Lynch ................................... | 156/89 |
| 3,852,877 | 12/1974 | Ahn et al. ............................. | 156/89 |
| 4,020,206 | 4/1977 | Beil ...................................... | 428/137 |
| 4,137,628 | 2/1979 | Suzuki .................................. | 156/89 |
| 4,164,442 | 8/1979 | Bartelmuss .......................... | 428/131 |
| 4,169,001 | 9/1979 | Kaiser .................................. | 428/137 |

FOREIGN PATENT DOCUMENTS 1538818 1/1979 United Kingdom .

OTHER PUBLICATIONS

IBM Technical Disclosure Bulletin vol. 21, No. 5, 1860–1861, 1862–1863 (1978).

*Primary Examiner*—William J. Van Balen
*Attorney, Agent, or Firm*—Craig and Antonelli

[57] ABSTRACT

A multilayer circuit board obtained by laminating and bonding a plurality of ceramic substrates, each substrate having holes therein and a conductive circuit pattern on at least one surface thereof, and bonding layers between each ceramic substrate, said bonding layers containing an organic or inorganic adhesive and an inorganic filler and having good electrical insulating properties, good thermal conductivity and a larger coefficient of thermal expansion than that of the ceramic substrate shows good thermal conductivity, wiring accuracy and productivity.

15 Claims, 2 Drawing Figures

MULTILAYER CIRCUIT BOARD

BACKGROUND OF THE INVENTION

This invention relates to a multilayer fired ceramic circuit board and a process for producing the same.

As multilayer circuit boards, there have been known those using glass fiber reinforced epoxy resin as substrates and those using ceramics such as alumina ceramics as substrates.

The former multilayer circuit boards are generally produced by laminating a plurality of alternate layers of glass-epoxy substrates and prepregs, said glass-epoxy substrates having conductive circuit patterns on the surfaces thereof and said prepregs made from a fibrous material impregnated with a thermosetting resin, bonding each other under pressure with heating, drilling holes, and conducting through hole plating. In such multilayer circuit boards, since thermal conductivity of the glass-epoxy substrate is small (about $7 \times 10^{-4}$ cal/cm.sec.°C.), heat resistance of it is large and thus it has poor heat dissipation. Therefore, there is a disadvantage in that when integrated circuits, large scale integrated circuits, etc., having a large heat release value, are directly mounted on such a glass-epoxy substrate in a high density, there takes place an excessive temperature rise, which results in making driving impossible.

On the other hand, in the case of the ceramic substrates, since alumina having thermal conductivity of $(5-8) \times 10^{-2}$ cal/cm.sec.°C. is used as a substrate, the substrate has good heat dissipation and can mount large scale integrated circuits, etc., in a high density. Such multilayer circuit boards having ceramic substrates as a main constituent can be produced by the following ways:

(1) A process for producing a multilayer ceramic circuit board comprising laminating a plurality of green ceramic sheets (unfired ceramic sheets) having printed conductive pastes thereon, making them into a laminated unit with a hot pressing operation, and sintering at a temperature of 1500° C. or higher (British Pat. No. 1,538,818: IBM Technical Disclosure Bulletin Vol. 21, No. 5, 1860-1861 (1978): ibid. Vol. 21, No. 5, 1862-1863 (1978), etc.).

(2) A process for producing a multilayer ceramic circuit board comprising printing alternatively a plurality of alternate layers of conductive paste of heat resistant metal such as tungsten, molybdenum, or the like and insulating paste of alumina series material on a green sheet and sintering these alternate layers (Denshi Zairyo No. 7, p. 59-63 (1974); Semiconductor/IC Conference Proceeding p. 71-77 (1972)).

(3) A process for producing a multilayer ceramic circuit board comprising printing alternatively a plurality of conductive layers and glass paste for forming insulating layers on a ceramic substrate and firing these alternate layers (Solid State Technology, No. 9, p. 63-66 (1978)).

According to the processes (1) and (2) mentioned above, since the procedure of sintering is conducted at 1500° C. or higher after the printing procedure, there takes place dimensional shrinkage of 15 to 20%, which results in forming warp of the substrates and producing deviations of dimensional accuracy and lowering the yield remarkably. According to the process (3) mentioned above, since the procedure of firing a conductive layer and the procedure of firing an insulating layer on the fired conductive layer and the procedure of firing a conductive layer on the fired insulating layer are repeated, there is a limitation in the number of layers to be laminated and about 4 layers can be laminated at most together with a disadvantage in workability.

In addition, Japanese patent appln. Kokoku (Post-Exam Publn) No. 5374/75 discloses a process for producing a multilayer ceramic plate comprising disposing a fired ceramic thin plate having a glass ceramic paste layer on the underside thereof on a fired ceramic thin plate having wiring patterns and welding them, filling holes formed on the disposed fired ceramic thin layer with a conductive paste and at the same time forming wiring patterns on the surface thereof, and repeating the procedure of lamination mentioned above. According to this process, since the lamination of one ceramic plate and filling of holes with a conductive paste and forming wiring patterns should be conducted one after another, this process is very disadvantageous from the viewpoint of productivity, particularly in the case of producing a multilayer ceramic plate having 10 to 20 or more layers of substrates.

Still further, Japanese patent appln. Kokai (Laid-Open) No. 79268/77 discloses a process for producing a multilayer printed wiring board using inorganic insulating plates comprising sandwitching an intermediate layer plate of an inorganic insulating plate having adhesive layers on the both sides thereof and having through conductors made of a low-melting metal between two printed wiring boards made of inorganic insulating plates having wiring patterns thereon, and forming a laminated unit from said two printed wiring boards sandwitching the intermediate layer plate by applying heat and pressure thereto. According to this process, only two layers of printed wiring boards can be laminated via an intermediate insulating plate having holes filled with conductive material for connecting the circuits. It is clear that this process cannot be applied to a process for producing a multilayer circuit board having 10 to 20 or more layers of substrates from the viewpoint of structure and workability.

SUMMARY OF THE INVENTION

It is an object of this invention to provide a multilayer circuit board having good thermal conductivity and good wiring accuracy overcoming the defects mentioned above. It is another object of this invention to provide a process for producing such a multilayer circuit board.

This invention provides a multilayer circuit board obtained by laminating and bonding, if required by one step, a plurality of ceramic substrates, each substrate having holes therein and a conductive circuit pattern on at least one surface thereof, and bonding layers between each ceramic substrate, said bonding layers having good electrical insulating properties, good thermal conductivity and a larger coefficient of thermal expansion ($\alpha$) than that of the ceramic substrate.

This invention also provides a process for producing a multilayer circuit board which comprises forming a conductive circuit pattern on at least one surface of a ceramic substrate having a number of holes therein, forming a bonding layer containing an organic or inorganic adhesive and an inorganic filler and having good electrical insulating properties, good thermal conductivity and a larger coefficient of thermal expansion ($\alpha$) than that of the ceramic substrate on at least one surface of the ceramic substrate, laminating a plurality of the thus treated ceramic substrates so as to form alternate layers of the ceramic substrates and the bonding layers, and bonding individual substrates and bonding layers under pressure with heating.

DETAILED DESCRIPTION OF THE INVENTION

Figure 1:
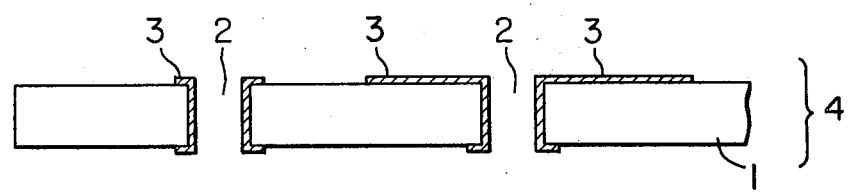
FIG. 1 is a cross-sectional view of a single ceramic substrate having a conductive layer with desired circuit pattern and holes therein.

As the ceramic substrates, there can be used plates of alumina mullite, beryllia, silicon nitride, silicon carbide, aluminum nitride, and the like alone or of a mixture thereof. In this invention, the term "ceramic substrate" includes only fired ceramic substrates and does not include unfired, i.e., green ceramic sheets. Thinner plates are preferable from the viewpoint of thermal conductivity, but taking strength of the ceramic substrate into consideration, the thickness of about 0.2 to 0.5 mm is suitable.

A single circuit board of ceramic substrate can be obtained by drilling a number of holes for connecting overlying substrates and underlying substrates and forming a conductive circuit pattern by using conventional methods. Such a single ceramic substrate is bonded each other by using the adhesive composition specialized in this invention to give a multilayer circuit board having a plurality of substrates, for example, 10 to 20 or more substrates.

The adhesive composition, which forms the bonding layer, used in this invention should have good electrical insulating properties and good thermal conductivity, for example, equal to or more than that of the substrate, preferably thermal conductivity of $3 \times 10^{-3}$ cal/cm·sec.°C. or more. In addition, the adhesive composition should also have a larger coefficient of thermal expansion ($\alpha$) than that of the ceramic substrate. Further, the adhesive should include one or more inorganic fillers having good electrical insulating properties and thermal conductivity in order to make the effects of this invention greater.

Examples of the inorganic fillers are beryllia, magnesia, zircon, alumina, silicon nitride, boron nitride, silicon carbide, aluminum nitride, and the like. The amount of fillers used in the adhesive composition depends on electrical insulating properties, thermal conductivity, coefficient of thermal expansion and other properties required for the adhesive layer (or bonding layer) as well as the kind of the adhesive, i.e. inorganic adhesive or organic adhesive. But generally speaking, in the case of inorganic adhesives, the filler is used in an amount of 10–60% by weight, more preferably 20–50% by weight based on the total weight of the inorganic adhesive and the filler, and in the case of organic adhesives, 30–90% by volume, more preferably 50–80% by volume based on the total volume of the organic adhesive and the filler. In other words, electrical insulating properties, thermal conductivity, coefficient of thermal expansion and the like of the bonding layer can be adjusted by the amount of filler to be added. This is one of the features of the invention.

Examples of the adhesives are inorganic adhesives such as glasses, phosphate adhesives and silicate adhesives and organic adhesives such as thermosetting resin adhesives, e.g. adhesives of epoxy resin, urea resin, melamine resin, carbolic acid resin, etc.

The case of using glasses as the adhesive is explained in detail hereinafter.

As the glasses, there can be used zinc borosilicate glasses, lead borosilicate glasses, barium borosilicate glasses, and the like. Among them, those having a larger coefficient of thermal expansion than that of the ceramic substrate are preferable. This is because, when the coefficient of thermal expansion of the glass is larger than that of the ceramic substrate, compression stress acts on the ceramic substrate, which results in increasing the strength of the multilayer board as well as improving reliability of the wiring pattern. Thermal conductivity of these glasses are usually 0.003 cal/cm·sec.°C. or more.

In practical use, glass powder and an inorganic filler such as alumina powder, beryllia powder, magnesia powder, silicon nitride powder, silicon carbide powder in an amount of preferably 10 to 60% by weight, more preferably 20 to 50% by weight of the total weight of the glass powder and the filler, are mixed with a dispersant such as nitrocellulose, amyl acetate, ethylcellulose, to give a paste, which is coated on at least one surface of the ceramic circuit board by a conventional coating method, e.g. a printing method, a spray method, or the like. Then, a plurality of ceramic substrates thus treated are laminated, if required, all the ceramic substrates to be bonded at a time, and heated at a temperature of the softening temperature of the glass or higher under a pressure of 1 to 50 kg/cm² to give a multilayer circuit board wherein individual circuit boards are bonded mutually. After removing the adhesive layer which obturates through holes by using, for example, a laser and plating the through holes by using, for example, electroless deposition, electroplating, and the like to give conductive layers, a multilayer circuit board is produced.

Multilayer ceramic circuit boards can also be produced in the same manner as mentioned above in the case of using phosphate adhesives or silicate adhesives containing one or more inorganic fillers.

As the phosphate adhesives, there can mainly be used aluminum phosphate series adhesives. When an aluminum phosphate series adhesive is heated to about 350° C. or lower, it is cured while reacting with the alumina of the substrate, so that strong bonding is possible. Further by the addition of fine alumina powder, beryllia powder or magnesia powder to it, thermal conductivity of the resulting bonding layer is improved.

As the silicate adhesives, there can be used sodium silicate series adhesives, potassium silicate series adhesives, and the like. When these adhesives are heated, dehydration condensation reaction takes place and individual ceramic circuit boards are bonded strongly. By the addition of alumina, beryllia or magnesia powder to these adhesives, thermal conductivity of the resulting bonding layers is improved.

In the case of the organic adhesives such as epoxy resins, one or more inorganic fillers such as beryllia, alumina, silicon nitride, boron nitride, and silicon carbide are mixed therewith. Thermal conductivity of the resulting adhesive compositions is dependent on the kinds and amounts of fillers to be mixed. Higher filler content is preferable, but excess content will reduce workability of adhesion and adhesive strength. Therefore, it is preferable to use the inorganic filler in an amount of 50 to 80% by volume based on the volume of the adhesive composition. Such an epoxy adhesive composition can be applied to ceramic circuit boards by using a conventional method. For example, such an epoxy adhesive composition can be cured by heating at about 80° to 180° C. for 5 to 60 minutes to bond ceramic circuit boards mutually. Thermal conductivity of an organic resin adhesive filled with an inorganic filler having good thermal conductivity is less than that of inorganic adhesives but higher than the resin itself in one unit (about $3 \times 10^{-3}$ cal/cm.sec.°C.). Further, since the thickness of one bonding layer is small, heat resistance of the resulting multilayer circuit board can be retained about 1/40 to 1/60 of that of conventional glass-epoxy series multilayer circuit boards, even if a plurality of single circuit boards are laminated.

Since the multilayer ceramic circuit boards according to this invention are composed of the ceramic substrates and the bonding layers obtained from the adhesive compositions having better thermal conductivity than the conventional glass-epoxy series substrates and prepregs, their heat dissipation properties are good. Further since conductive circuit patterns are formed on the fired ceramic substrates, no deformation takes place and pattern accuracy is high comparing with the ceramic circuit boards produced by printing conductive circuit patterns on deformable green sheets, and firing at a temperature of 1500° C. or higher, which results in increasing the yield of the products. Still further, multilayer ceramic circuit boards having higher wiring concentration than the conventional ones can easily be produced according to this invention. For example, the breadth of conductive circuit patterns formed by printing circuit patterns on green sheets and firing them is about 100 $\mu$m at minimum, whereas conductive circuit patterns having a breadth of about 20 $\mu$m can easily be formed according to this invention by forming a conductive layer on the whole surface of a ceramic substrate by using, for example, a plating method and subsequently finishing the desired circuit patterns by using e.g. a hot etching technique.

When the multilayer ceramic circuit boards of this invention are produced by bonding a plurality of alumina circuit boards with an inorganic adhesive containing one or more inorganic fillers, if required by one step, they are stable chemically, so that they can be directly cooled by using a cooling medium such as Freon, or the like.

This invention is illustrated by way of the following examples, in which all percents and parts are by weight unless otherwise specified.

EXAMPLE 1

(1) An alumina ceramic substrate 1 (as shown in FIG. 1) having dimensions of $100 \times 100 \times 0.35$ mm (coefficient of thermal expansion $75 \times 10^{-7}$/°C.) was drilled by a $CO_2$ laser to give 10000 holes 2 (FIG. 1) having a diameter of 150 $\mu$m.

(2) A conductive layer 3 was formed on the ceramic substrate mentioned above by using the following method. The thus treated substrate was subjected to degreasing treatment, dipped in a catalyst solution HS 101 B (trade name, manufactured by Hitachi Chemical Co., Ltd), washed with water and subjected to activation treatment by using an aqueous solution of hydrochloric acid and oxalic acid. Subsequently the substrate was dipped in a plating bath having the following composition at 65° C. for 10 to 15 minutes to give a nickel plating layer of about 1 $\mu$m thick.

Plating bath composition:

| | |
|---|---|
| Nickel sulfate | 0.04 mole/l. |
| Sodium citrate | 0.25 mole/l. |
| Boric acid | 0.50 mole/l. |
| Sodium hypophosphite | 0.1 mole/l. |

In the next place, electroplating of copper was conducted on the nickel layer in order to better electroconductivity of the conductive layer by using the following method.

That is, a bath having a composition of

| | |
|---|---|
| Copper pyrophosphate ($CuP_2O_7 \cdot 3H_2O$) | 90 g/l. |
| Potassium pyrophosphate ($K_4P_2O_7$) | 350 g/l. |
| Ammonia water | 3 ml/l. | adjusted to pH 8.8 was used for conducting plating at a bath temperature of 55° C. and current density of 3 A/dm² for 1 hour to give a copper plating layer of 20 $\mu$m thick.

(3) Formation of Conductive Circuit Pattern

Photoresist ink OMR-83 (trade name, manufactured by Tokyo Ohka Kogyo Co., Ltd., Japan) was coated on the conductive layer mentioned above and exposed to light through the desired pattern. Uncured portions of the photoresist were romoved by a conventional method. Then, the exposed conductive layer was etched at 45° C. for 3 minutes by using an aqueous solution of 40% ferric chloride. Thus a ceramic circuit board 4 (a single board) having the desired conductive circuit pattern was produced.

When a ceramic circuit board having conductive patterns on the both sides is desired, the light exposure procedure mentioned above is to be conducted on the both sides of the substrate.

FIG. 1 is a cross-sectional view of the thus produced ceramic circuit board (a single board), wherein numeral 1 denotes the ceramic substrate, numeral 2 through hole, numeral 3 the conductive layer and numeral 4 the single ceramic circuit board.

(4) Adhesion of ceramic circuit boards

Individual surfaces to be bonded of the ceramic circuit boards 4 thus produced by the procedures mentioned above having various kinds of conductive circuit patterns were coated with a glass paste by a screen printing process. The compositions of the glasses and properties thereof are listed in Table 1.

TABLE 1

| Run No. | Components of glass (%) | | | | | | Alumina powder (%) | Coefficient of thermal expansion ($\times 10^{-7}$/°C.) | Bonding temperature (°C.) |
|---|---|---|---|---|---|---|---|---|---|
| | PbO | ZnO | $B_2O_3$ | $SiO_2$ | $Al_2O_3$ | Others | | | |
| 1 | 63 | 19 | 12 | 5 | — | 1 | 30 | 81.5 | 450 |
| 2 | 77 | 8 | 12 | 3 | — | — | 20 | 97 | 430 |
| 3 | 74 | 10 | 9 | 3 | 1 | 3 | 40 | 96 | 460 |

TABLE 1-continued

| Run No. | Components of glass (%) | | | | | | Alumina powder (%) | Coefficient of thermal expansion ($\times 10^{-7}/°C$) | Bonding temperature (°C) |
| --- | --- | --- | --- | --- | --- | --- | --- | --- | --- |
| | PbO | ZnO | $B_2O_3$ | $SiO_2$ | $Al_2O_3$ | Others | | | |
| 4 | 70 | — | 15 | 9 | — | — | 50 | 107 | 500 |
| 5 | ASF 1301 (Asahi Glass Co., Ltd) | | | | | | 35 | 110 | 550 |
| 6 | 7976 (Corning Glass Works) | | | | | | 35 | 105 | 550 |
| 7 | 0120 (Corning Glass Works) | | | | | | 35 | 94 | 530 |
| 8 | M305 (Tokyo Shibaura Electric Co., Ltd.) | | | | | | 45 | 92 | 800 |
| 9 | M310 (Tokyo Shibaura Electric Co., Ltd.) | | | | | | 40 | 110 | 750 |
| 10 | ST-W (Nippon Electric Co., Ltd.) | | | | | | 40 | 95 | 780 |

A glass paste was prepared by dispersing 100 g of glass powder together with 20 to 50% of alumina powder in 100 g of amyl acetate. The glass paste was coated on one side of the ceramic circuit board mentioned above. 5 Sheets of the thus treated ceramic circuit boards were laminated and fixed followed by heating at the bonding temperature as listed in Table 1 for 0.5 hour under a pressure of 50 kg/cm² and an inert gas atmosphere. Then the resulting laminated board was cooled gradually.

Since compression stress due to the bonding layer was applied to individual substrates of the thus obtained multilayer ceramic circuit boards, there took place no delamination of the conductive patterns, no short circuit and no disconnection after the heat cycle test according to MIL-STD-202D Method 107C condition B, i.e. (−65° C., 2 hours→room temperature, 5 minutes→+125° C., 2 hours→room temperature, 5 minutes,→−65° C.)×40 cycles.

(5) Pretreatment of Through Holes for Penetration

In order to remove obturation of through holes by oozed glass formed during the lamination of the ceramic substrates, the through holes were drilled by using a laser.

(6) Through Hole Plating

Figure 2:
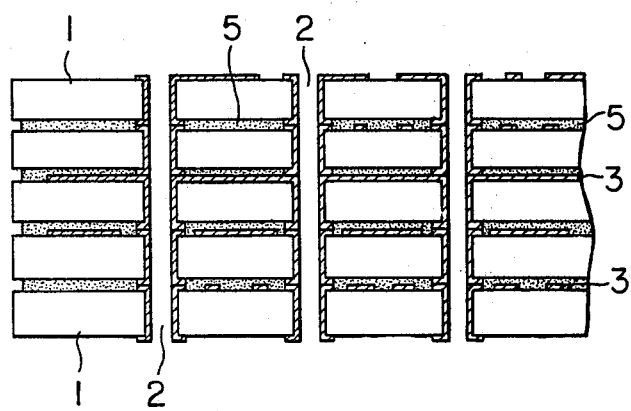
FIG. 2 is a cross-sectional view of a multilayer circuit board of this invention.

The through holes were plated again by using the copper electroplating bath mentioned above to give conductive through holes. The resulting multilayer ceramic circuit board had a cross-section as shown in FIG. 2, wherein numeral 5 denotes the bonding layer.

EXAMPLE 2

A multilayer ceramic circuit board was produced in the same manner as described in Example 1 by using a mullite ceramic plate having demensions of 100×100×0.30 mm (coefficient of thermal expansion $45 \times 10^{-7}/°C$) and a phosphate adhesive having a coefficient of thermal expansion of $70-90 \times 10^{-7}/°C$. More concretely, a paste prepared by mixing aluminum dihydrogenphosphate obtained from 1 part of phosphoric acid and 0.8 part of aluminum hydroxide with 5 parts of alumina powder having a particle size of 10 μm or less and 5 parts of water was coated on the mullite ceramic plate by a printing process. 5 Sheets of the thus treated mullite ceramic plates are laminated, fixed, heated at 250° C.–400° C. for 1 hour under a pressure of 50 kg/cm² and bonded. After plating through holes, a multilayer ceramic circuit board having the same good properties as those obtained in Example 1 was produced.

EXAMPLE 3

A multilayer ceramic circuit board was produced in the same manner as described in Example 1 except for using a silicate adhesive (SUMICERAM S-301, manufactured by Sumitomo Chemical Co., Ltd., coefficient of thermal expansion $95 \times 10^{-7}/°C$) containing 30% of alumina powder in place of the glass composition of Run No. 1 and bonded with heating under pressure at 150° C. for 1 hour.

Heat resistance ($\theta$) of the resulting multilayer ceramic circuit board was compared with a conventional glass-epoxy multilayer circuit board having the same number of layers as that mentioned above with the results that the conventional circuit board showed $\theta = 70$ while the circuit board of this invention showed $\theta = 1$.

Heat resistance was determined by measuring thermal conductivity by the laser flash method and calculating the following formula:

$$\text{Heat resistance } (\theta) = h/\lambda$$

wherein h is the thickness of the sample (cm) and $\lambda$ is thermal conductivity (cal/cm.sec.°C). The laser flash method is a method of radiating heat instantly on one surface of a sample by using a ruby laser and detecting the heat transmitting the sample by using an alumel-chromel thermocouple fixed on the back side of the sample. By the laser flash method, heat diffusion rate, thermal conductivity can be detected.

EXAMPLE 4

Multilayer ceramic circuit boards were produced in the same manner as described in Example 1 except for using epoxy resin adhesives containing as filler alumina, silicon carbide, beryllia, zircon or silicon nitride having a parcle size of 5 to 30 μm as shown in Table 2 and bonding under a pressure of 50 kg/cm² at 120° C. for 30 minutes. In Table 2, adhesive compositions, and their coefficients of thermal expansion and thermal conductivity are also listed. The following materials were used for preparing the adhesive compositions.

Resin:
Epikote 828, 1001, and 1004 (bisphenol A type, manufactured by Shell Chemical Co.)
CH 206 (vinyl cyclohexane dioxide, manufactured by Chisso Corp.)

Curing agent:
B-001 (modified heterocyclic diamine, manufactured by Mitsubishi Petrochemical Co., Ltd.)
EH-531 (modified aromatic amine, manufactured by Asahi Denka Kogyo Kabushiki Kaisha)
HP-607N (phenol resin, manufactured by Hitachi Chemical Co., Ltd.)
HN 2200 (methyl tetrahydrophthalic anhydride, manufactured by Hitachi Chemical Co., Ltd.)

Curing accelerator:
EMI 24 (2-ethyl-4-methyl-imidazole, manufactured by Toray Industries, Inc.)

TABLE 2

| Run No. | Epoxy resin name | parts | Curing agent name | parts | Filler name | vol. % | Coefficient of thermal expansion ($\times 10^{-7}/°C$) | Thermal conductivity (cal/cm · sec · °C) |
|---|---|---|---|---|---|---|---|---|
| 1 | Epikote 828 | 100 | B-001 / EH-531 | 30 / 30 | $Al_2O_3$ | 70 | 150 | 0.012 |
| 2 | " | " | B-001 / EH-531 | " | SiC | 70 | 130 | 0.015 |
| 3 | " | " | B-001 / EH-531 | " | BeO | 70 | 150 | 0.025 |
| 4 | " | " | B-001 / EH-531 | " | $Si_3N_4$ | 70 | 130 | 0.012 |
| 5 | Epikote 1001 / Epikote 1004 | 30 / 30 | HP-607N | 15 | $Al_2O_3$ | 80 | 120 | 0.020 |
| 6 | CH 206 | 100 | HN 2200 / EMI 24 | 100 / 3 | $Al_2O_3$ | 50 | 270 | 0.0035 |
| 7 | " | " | HN 2200 / EMI 24 | 100 / 3 | $Al_2O_3$ | 70 | 170 | 0.012 |
| 8 | " | " | HN 2200 / EMI 24 | 100 / 3 | $Al_2O_3$ | 80 | 120 | 0.020 |
| 9 | " | " | HN 2200 / EMI 24 | 100 / 3 | $Si_3N_4$ | 55 | 240 | 0.003 |
| 10 | " | " | HN 2200 / EMI 24 | 100 / 3 | $Si_3N_4$ | 65 | 190 | 0.0050 |
| 11 | " | " | HN 2200 / EMI 24 | 100 / 3 | $Si_3N_4$ | 75 | 130 | 0.010 |
| 12 | " | " | HN 2200 / EMI 24 | 100 / 3 | $ZrSiO_4$ | 75 | 120 | 0.003 |
| 13 | " | " | HN 2200 / EMI 24 | 100 / 3 | $ZrSiO_4$ | 80 | 100 | 0.005 |

Heat resistance of the multilayer ceramic circuit boards thus produced was about 1/60 of the value of conventional glass-epoxy multilayer circuit board.

What is claimed is:

1. A multilayer circuit board obtained by laminating and bonding a plurality of ceramic substrates, each substrate having holes therein and a conductive circuit pattern on at least one surface thereof, and electrically insulative bonding layers between adjacent ceramic substrates, said bonding layers having good thermal conductivity and a larger coefficient of thermal expansion than that of the ceramic substrate.

2. A multilayer circuit board according to claim 1, wherein the ceramic substrates are of alumina, mullite, beryllia, silicon nitride, silicon carbide, aluminum nitride or of the combinations thereof.

3. A multilayer circuit board according to claim 1, wherein the bonding layer contains an organic or inorganic adhesive and an inorganic filler.

4. A multilayer circuit board according to claim 3, wherein the organic adhesive is an epoxy resin.

5. A multilayer circuit board according to claim 3, wherein the inorganic adhesive is a glass, a phosphate adhesive or a silicate adhesive.

6. A multilayer circuit board according to claim 3, wherein the inorganic filler is beryllia, magnesia, zircon, alumina, silicon nitride, boron nitride, or silicon carbide.

7. A multilayer circuit board according to claim 3, wherein the inorganic adhesive is an epoxy resin and the inorganic filler is beryllia, zircon, alumina, silicon nitride, boron nitride, or silicon carbide.

8. A multilayer circuit board according to claim 3, wherein the inorganic adhesive is a glass and the inorganic filler is alumina.

9. A multilayer circuit board according to claim 3, wherein the inorganic adhesive is a phosphate adhesive and the inorganic filler is alumina.

10. A multilayer circuit board according to claim 3, wherein the inorganic adhesive is a silicate adhesive and the inorganic filler is alumina or beryllia.

11. A process for producing a multilayer circuit board which comprises
forming a conductive circuit pattern on at least one surface of a ceramic substrate having a number of holes therein,
forming an electrically insulation bonding layer containing an organic or inorganic adhesive and one or more inorganic fillers of good thermal conductivity and a larger coefficient of thermal expansion than that of the ceramic substrate on at least one surface of the ceramic substrate,
laminating a plurality of the thus treated ceramic substrates so as to form alternate layers of the ceramic substrates and the bonding layers, and
bonding individual substrates and bonding layers under pressure with heating.

12. A process acccording to claim 11, wherein the organic adhesive is an epoxy resin and the inorganic filler is beryllia, zircon, alumina, silicon nitride, boron nitride or silicon carbide.

13. A process according to claim 11, wherein the inorganic adhesive is a glass and the inorganic filler is alumina.

14. A process according to claim 11, wherein the inorganic adhesive is a phosphate adhesive and the inorganic filler is alumina.

15. A process according to claim 11, wherein the inorganic adhesive is a silicate adhesive and the inorganic filler is alumina or beryllia.

* * * * *